United States Patent [19]
Zintler et al.

[11] Patent Number: 5,823,798
[45] Date of Patent: Oct. 20, 1998

[54] ELECTRIC CENTER FOR MOTOR VEHICLES

[75] Inventors: Albert Zintler, Gross-Gerau; Dieter Busch, Rosbach; Horst Ullrich, Schöneck, all of Germany

[73] Assignee: VDO Adolf Schindling AG, Frankfurt, Germany

[21] Appl. No.: 703,341

[22] Filed: Aug. 26, 1996

[30] Foreign Application Priority Data

Aug. 25, 1995 [DE] Germany .................. 195 31 537.5
Nov. 28, 1995 [DE] Germany .................. 195 44 235.0

[51] Int. Cl.$^6$ ...................................... H01R 9/09
[52] U.S. Cl. ............................................. 439/76.2
[58] Field of Search .................. 439/76.2, 949, 439/621

[56] References Cited

U.S. PATENT DOCUMENTS 5,023,752  6/1991  Detter et al. ..................... 361/399
5,154,647  10/1992  Ishitani et al. .................... 439/933
5,285,011  2/1994  Shimochi ......................... 439/76.2

*Primary Examiner*—Neil Abrams
*Assistant Examiner*—T. C. Patel
*Attorney, Agent, or Firm*—Martin A. Farber

[57] ABSTRACT

An electric center for motor vehicles has an electric part by which different electric power levels are connected to each other. The electric center is arranged on an insulating part holder, and connectors of the electric part engage into the insulating part holder. In order to assure a compact electric center for motor vehicles which is insensitive to disturbance, at least one connector of the electric part which is acted on with a higher power is contacted by a current feed on the side of the part holder facing away from the part holder. At least one low-load connector of the electronic component is connected with a holder member bearing electronic components, the holder member being physically separated from the insulating part holder.

11 Claims, 2 Drawing Sheets

ELECTRIC CENTER FOR MOTOR VEHICLES

FIELD AND BACKGROUND OF THE INVENTION

The present invention relates to an electric center for motor vehicles in which an electric part, by which different electric power levels are connected to each other, is arranged on an insulating component holder. Connections of the electric part engage into the insulating component holder.

Such an electric center fulfills essentially a distributing function in order to provide the electrical devices of the motor vehicle such as, for instance, windshield wiper or blinkers, etc., via electric wires or cable harnesses, with electric voltage and monitor the operability of the electrical devices. The control of the electrical devices is effected here via switch devices which are arranged on the top of the electric center together with the fuses of the circuits of the electrical devices.

The switch devices which are placed thereon generally contain a relay by which the control of the corresponding electrical device is effected.

This has the disadvantage that the electrical network of a motor vehicle operates on different electric power levels which must be handled within a very small space in the electric center, which increases the sensitivity to disturbance of the individual electrical parts.

SUMMARY OF THE INVENTION

It is an object of the invention therefore to provide a compact electric center for motor vehicles which is insensitive to disturbance.

According to the invention, on the side of a component holder, or support, (2) facing away from an electric part (8) which may be a relay, there is at least one connector (11) of the electric part (8) which is acted on by a higher power, and is contacted with a current feed (23), while at least one low-load connector (10) of the electric part (8) is connected to a holder member (13) which bears electronic components and is physically separated from the insulated component support (2).

The advantage of the invention is that, due to the contacting at different spaces and the uncoupling connected therewith of the different electric power levels, an increase in the assurance against disturbances of the electric and electronic components is provided.

The connector (10) of the part (8) which is acted on by the low load is advantageously connected to the holder member (13) by a double-plug contact device (12).

In one embodiment, the insulating part holder (2) and the holder member (13) bearing the electronic components are arranged at least partially overlapping in different planes in space. The contact device (12) permits the feeding of signals from the electric part (8) to the electronic circuit, and is arranged on the holder member (13) in order to receive the low-load connector (10) of the electric part (8).

The stacked arrangement of the two part holders thus permits a compact construction of the electric center.

In order to facilitate the mounting, the contacting device has a double-arm spring contact into which the connectors of the electric part which protrude beyond the part component holder can be clamped. A spring contact can be inserted in a contact module which is arranged on the holder member, and contains two contact springs which are urged towards each other.

The contacting device which is developed as a plug connection assures a simpler handling upon mounting and repair since, for example, the holder member can be removed from the housing and replaced without removal of the electric parts on the top of the housing.

According to a feature of the invention, the connectors (10) of the electric part (8) protrude beyond the part holder (2). The contact device (12) has a two-arm spring contact (18, 19, 20) within which the connectors (10) of the electric part (8) can be clamped. The spring contact (18, 19, 20) can be inserted into a contact module (17). The contact module (17) is arranged on the holder member (13) and contains two contact springs (14, 15) which are urged towards each other.

In a further development, the insulating part holder (2) forms the top part of a housing (1). The holder member (13) which bears the electronic components is adapted to be inserted into the housing. In this connection, the housing is developed in box shape on one side wall on which there is arranged a second contacting device to receive the connector of the electric part which carries the higher power.

In the manufacturing process, therefore, the part holder can be provided with the parts before the electronic module is introduced into the housing.

Further, according to a feature of the invention, the housing (1) is developed in box shape, on a side wall (4) upon which there is arranged a second contacting device (22) to receive the connector (11) of the electric part (8) which is acted on with a higher power.

Another feature of the invention is that the second contacting device (22) is a two-arm spring contact which connects the electric connector (11) of the electric part (8) to an electric line (23).

Still further according to a feature of the invention, there is a partition wall (26) which is arranged perpendicular to the part holder (2). The second contacting device (22) is fastened by means of a side arm (25) from the side wall (4) of the housing and the partition wall (26).

Still another feature of the invention is that the second contacting device (22) is held by an anti-pull-out device (27) which, starting from a cover plate (3) of the housing (1), is brought against the contacting device (22).

According to yet another feature, the holder member (13) is a circuit board. According to still another feature, the holder member (13) is a housing in which the electronic components are arranged.

BRIEF DESCRIPTION OF THE DRAWINGS

With the above and other objects and advantages in view, the present invention will become more clearly understood in connection with the detailed description of the preferred embodiments, when considered with the accompanying drawings, of which.

DETAILED DESCRIPTION OF THE PREFERRED EMBODIMENTS

Figure 1:
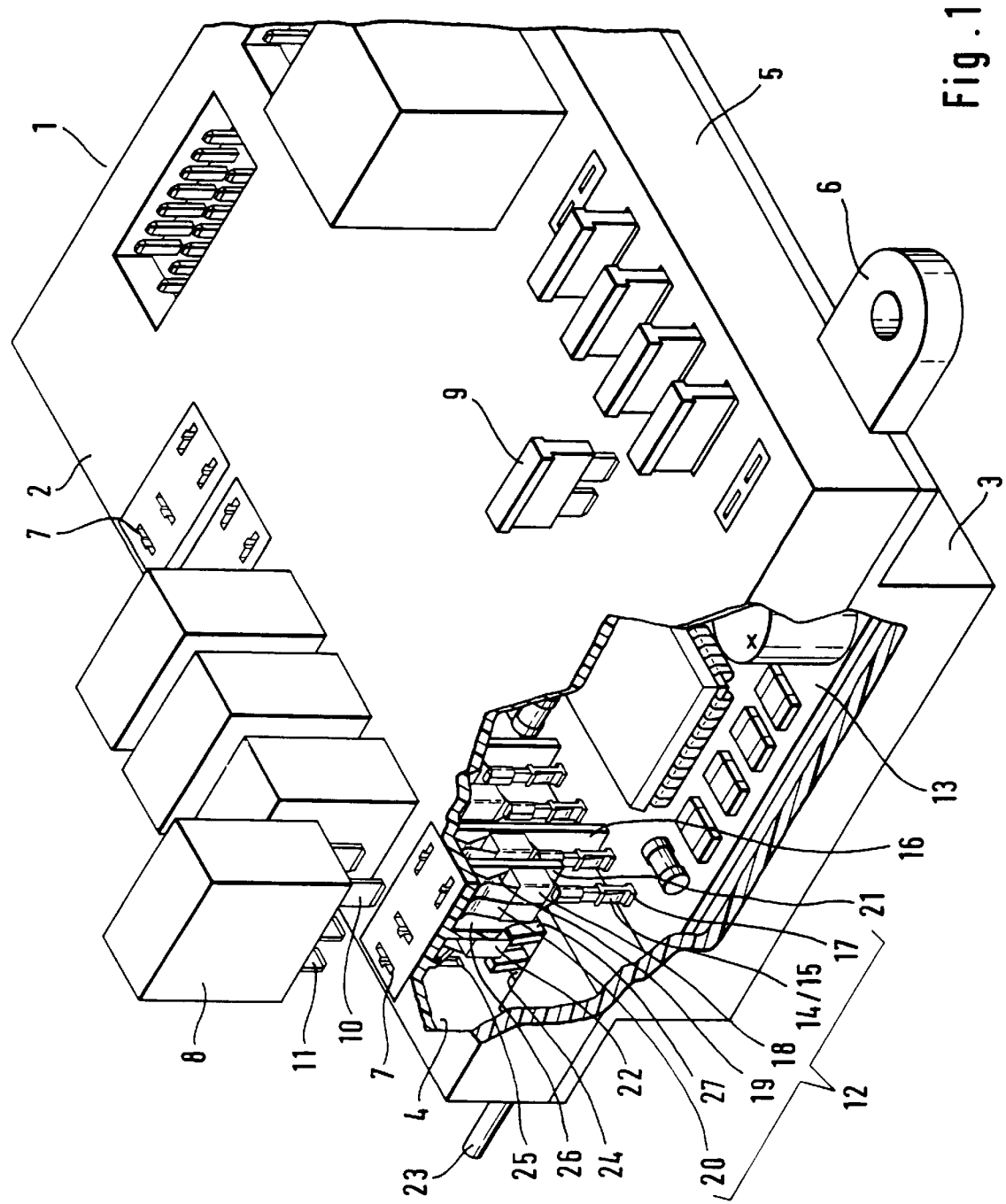
FIG. 1 is a perspective view of the electric center in accordance with the invention for motor vehicles.

The electric center of the invention consists of a box-shaped housing 1 of insulating material which has a top part 2, a cover plate 3, and two side walls 4 and 5. The top part 2 and the two side walls 4 and 5 have a connection to each other in the shape of a trough. The cover plate 3 has a plurality of attachment lugs 6 (one of which is shown in FIG. 1) by which the electric center is fastened, preferably bolted, in the engine compartment of the vehicle.

The top part 2 of the housing 1 has numerous sockets 7 into which electric parts 8 such as relys, fuses 9 or other electric parts are inserted. This, and other features to be described, allow for connection of various values of electric current and voltage to respective electric circuits and components of a motor vehicle.

In the following, reference will be made only to the contacting of a part 8 (relay). A similar contacting of other electric parts can also be made.

The part 8 has coil connectors (plug pin 10) and switch contacts (plug pin 11) which are subjected to different loads.

The plug pins 10 and 11 of the part 8 are, in this connection, introduced for the contacting into the sockets 7 of the top part 2, and are so dimensioned that they extend beyond the top part 2 into the trough-shaped housing.

In order now to be able to produce an electric center having these different electric power levels, and which is compact but nevertheless of low mounting expense, the plug pin 10 of the part 8 which carries lower power is connected by a first double-plug contact device 12 to a holder member 13 which bears an electronic control circuit, for instance for controlling windshield wiper motors.

Figure 2:
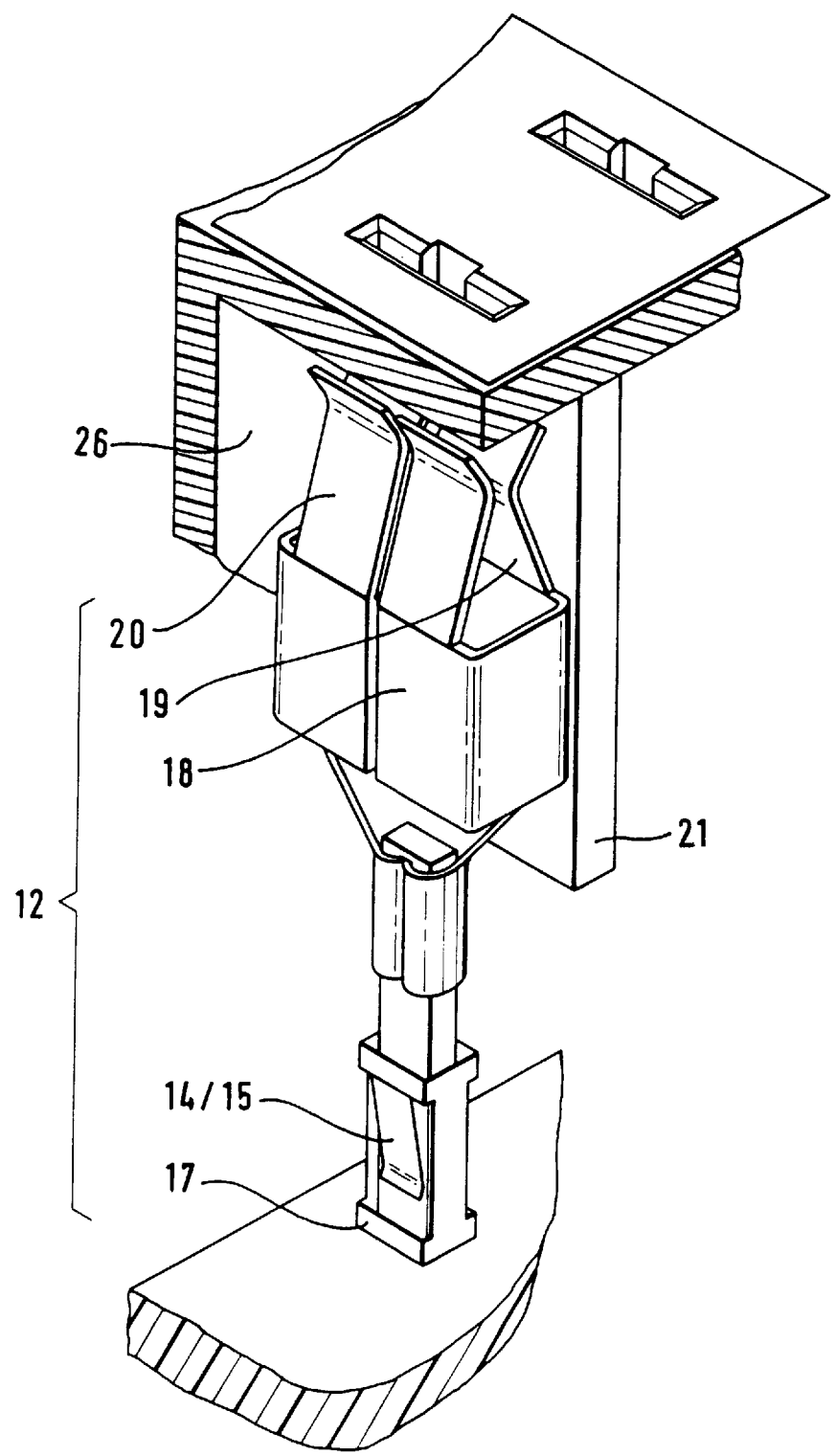
FIG. 2 is a perspective view of a contacting device of the electric center of FIG. 1.

The first contact device 12 (FIG. 2) is in this connection connected electrically to conductive paths (not shown in detail) which are present on the holder member 13. Thus, the switch contact 10 of the part 8 is developed with the electronic control circuit representing a low-voltage current circuit, and a feeding of the signal assured.

The contact device 12 itself consists here of a contact module 17 which is fastened directly on the holder member 13. The contact module 17 contains two facing contact springs 14 and 15 which are urged towards each other, and into which a metallic spring contact 18 is clamped. This metallic spring contact 18 in its turn consists of a pin on which two identical pairs of springs, which face the plug pin 10, are arranged. Each pair of springs has two parts 19 and 20 which are stressed towards each other. The plug pin 10 of the part 8 is introduced into the two spring pairs and contacted. The spring pairs and the pin constitute one part or, alternatively, the pin is crimped on the pair of springs The pin of the spring contact 18 engages into the contact module 17. In order to assure a dependable mounting of the plug pin with the spring contact 18, there is provided a partition wall 21 which is formed perpendicular to the top part 2. The partition wall 21, in concert which with a further partition wall 16 bearing the holder member 13, serve to position the contact arms 19 and 20 of the spring contact 18.

Upon the mounting of the electric center, the holder member 13 is placed on the contact device 12 and supported by the housing side wall 5 as well as on the free end of the partition wall 16 arranged perpendicular to the housing top part 2.

A contact device 22 of similar development receives the plug pin 11 of the relay 8 which is acted on by a higher power, this contacting device connecting the plug pin 11 to an electric wire 23 of the cable harness of the motor vehicle for the feeding of current. The wire 23 is introduced into the electric center through a housing opening 24 present in the cover plate 3. For the holding of the contacting device 22, particularly the contact module thereof, the side wall of the housing 1 has a side arm 25. Furthermore, the perpendicular partition wall 26 is continuous from the top part 2 to the cover plate 3. The contacting device 22 is guided in this connection between the side wall 4 and the partition wall 26.

A detent nose which is fastened on the contacting device 22, but is not further shown, serves to fasten the contacting device 22 on the side arm 25. For the relief of the pull on the contacting device 22, an anti-pull-out device 27 is provided. This anti-pull-out device 27 is developed as an arm and, starting from the cover plate 3, presses from below against the second contacting device 22.

In another embodiment, the holder member 13 which contains the electronic circuit, is arranged in a housing, not shown in detail. On this housing there is fastened the contact module 17 of the contact device 12, by which the low-load connector 11 of the electric part 8 is contacted, as described above, with the circuit board 13.

We claim:

1. An electric center for a motor vehicle comprising:

an electric part serving to connect a plurality of differing electric power levels to respective ones of a plurality of components of the motor vehicle;

a current feed, a holder member configured as an electric circuit board, and an insulating component support supporting the electric part, there being connections of the electric part which engage into the insulating component support;

a contact module secured to the circuit board, and a contact device engageable with the contact module;

wherein said electric part has at least one high-power connector and at least one low-load connector;

on a side of said component support facing away from said electric part, said at least one high power connector of said electric part is acted on by a higher power and is contacted with said current feed;

said at least one low-load connector of said electric part is connected via said contact device and said contact module to said holder member; and said holder member bears electronic components and is physically separated from said insulated component support.

2. An electric center according to claim 1, wherein said first and said second contact devices are located on opposite sides of said partition wall.

3. An electric center according to claim 1, wherein said holder member forms a part of a housing for housing electronic components.

4. An electric center according to claim 1, wherein said contact device is a double-plug contact device, said low-load connector of the electric part is acted on by a low load.

5. An electric center according to claim 4, wherein said insulating component support, and said holder member bearing the electronic components are arranged at least partially overlapping in different planes in space; and said double plug contact device permits a feeding of signals from said electric part to an electronic circuit on said circuit board is supported on said holder member by said contact module in order to receive said low-load connector of the electric part.

6. An electric center according to claim 5, wherein said connectors of said electric part protrude beyond said component support;

said double-plug contact device has a two-arm spring contact within which said at least one low-load connector of the electric part is clamped; and the spring contact is insertable into the contact module, and comprises two contact springs which are urged towards each other.

7. An electric center according to claim 1, further comprising a housing, said insulating components support forming a top part of the housing, and said holder member supporting electronic components which are insertable into said housing.

8. An electric center according to claim 7, wherein said contact device is a first contact device, said electric center further comprising a second contact device; wherein said housing has a box shape, and comprises a side wall which supports said second contact device, said second contact device serving to receive said high-power connector of the electric part for operation with higher power than is communicated by said low-load connector.

9. An electric center according to claim 8, wherein said second contact device is a two-arm spring contact which serves for connection of said high-power electric connector of the electric part to an electric line.

10. An electric center according to claim 9, further comprising a side arm connected to said housing side wall, and a partition wall arranged perpendicular to said component support; and wherein said second contacting device is fastened by means of said side arm from said housing side wall and said partition wall.

11. An electric center according to claim 10, further comprising a cover plate secured to said component support, and an anti-pull-out device; and wherein said second contact device is held by said anti-pull-out device; and wherein said anti-pull-out device extends from said cover plate to engage said second contact device.

* * * * *